United States Patent
Giaconi et al.

(10) Patent No.: US 10,235,488 B2
(45) Date of Patent: *Mar. 19, 2019

(54) APPLICATION SPECIFIC INTEGRATED CIRCUIT INTERCONNECT

(71) Applicant: CHRONOS TECH LLC, San Diego, CA (US)

(72) Inventors: Stefano Giaconi, San Diego, CA (US); Giacomo Rinaldi, San Diego, CA (US)

(73) Assignee: Chronos Tech LLC, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/876,047

(22) Filed: Jan. 19, 2018

(65) Prior Publication Data

US 2018/0144079 A1    May 24, 2018

Related U.S. Application Data

(63) Continuation of application No. 15/344,416, filed on Nov. 4, 2016.

(60) Provisional application No. 62/372,217, filed on Aug. 8, 2016, provisional application No. 62/250,998, filed on Nov. 4, 2015.

(51) Int. Cl.
| | | |
|---|---|---|
| *G06F 17/50* | (2006.01) | |
| *G06F 13/42* | (2006.01) | |
| *H04L 12/40* | (2006.01) | |
| *H04L 12/801* | (2013.01) | |

(52) U.S. Cl.
CPC ...... *G06F 17/5054* (2013.01); *G06F 13/4295* (2013.01); *G06F 17/5059* (2013.01); *H04L 12/40006* (2013.01); *H04L 47/10* (2013.01)

(58) Field of Classification Search
CPC ... H04L 12/40006; H04L 47/10; G06F 13/42; G06F 13/4295
See application file for complete search history.

(56) References Cited

U.S. PATENT DOCUMENTS

| | | | |
|---|---|---|---|
| 4,189,625 A * | 2/1980 | Strandberg | H04B 1/662 375/240 |
| 9,977,852 B2 * | 5/2018 | Giaconi | G06F 17/5054 |
| 9,977,853 B2 * | 5/2018 | Giaconi | G06F 17/5054 |
| 2003/0035496 A1 * | 2/2003 | Noda | H04L 27/186 375/308 |
| 2004/0151209 A1 * | 8/2004 | Cummings | G06F 1/12 370/503 |
| 2005/0180514 A1 * | 8/2005 | Choi | G06F 1/3203 375/257 |

(Continued)

*Primary Examiner* — David B Lugo
(74) *Attorney, Agent, or Firm* — Procopio; Mark W. Catanese; Noel C. Gillespie

(57) ABSTRACT

Systems and methods for providing Chronos Channel interconnects in an ASIC are provided. Chronos Channels rely on a reduced set of timing assumptions and are robust against delay variations. Chronos Channels transmit data using delay insensitive (DI) codes and quasi-delay-insensitive (QDI) logic. Chronos Channels are insensitive to all wire and gate delay variations, but for those belonging to a few specific forking logic paths called isochronic forks. Chronos Channels use temporal compression in internal paths to reduce the overheads of QDI logic and efficiently transmit data. Chronos Channels are defined by a combination of a DI code, a temporal compression ratio and hardware.

13 Claims, 10 Drawing Sheets

(56) References Cited

U.S. PATENT DOCUMENTS

| | | |
|---|---|---|
| 2005/0200388 A1* | 9/2005 | Har .................. H04L 12/40013 |
| | | 327/103 |
| 2008/0285743 A1 | 11/2008 | Yokota et al. |
| 2008/0304430 A1 | 12/2008 | Zhuyan |
| 2009/0106719 A1 | 4/2009 | Stevens |
| 2010/0285743 A1 | 11/2010 | Li et al. |
| 2016/0188522 A1* | 6/2016 | Hilgemberg Pontes ..................... |
| | | G06F 13/4226 |
| | | 710/106 |
| 2017/0091130 A1 | 3/2017 | Matsunaga |
| 2017/0308721 A1 | 10/2017 | Pedersen |
| 2018/0109415 A1 | 4/2018 | Han et al. |

* cited by examiner

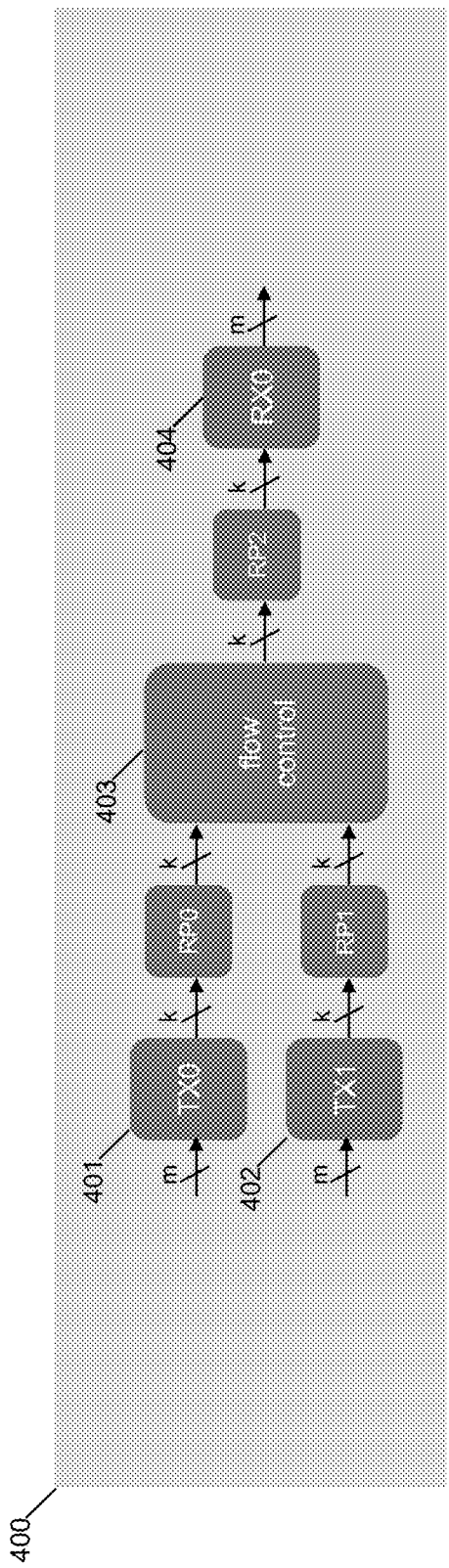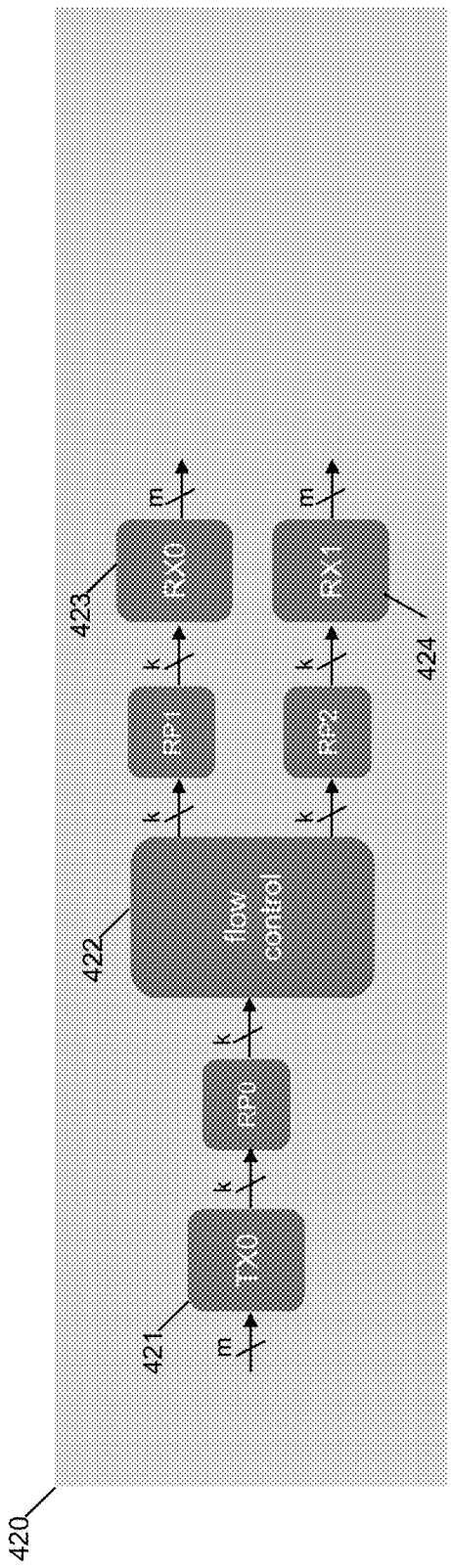
FIG. 4A
FIG. 4B

APPLICATION SPECIFIC INTEGRATED CIRCUIT INTERCONNECT

RELATED APPLICATIONS INFORMATION

This present application is a continuation of U.S. patent application Ser. No. 15/344,416, entitled "Application specific integrated circuit interconnect," filed on Nov. 4, 2016, which claims the benefit of priority under 35 U.S.C. 119(e) to Provisional Patent Application Ser. No. 62/372,217, entitled "Application Specific Integrated Circuit Point-to-Point Interconnect," filed Aug. 8, 2016 and claims the benefit of priority under 35 U.S.C. 119(e) to Provisional Patent Application Ser. No. 62/250,998, entitled "Application Specific Integrated Circuit Point-to-Point Interconnect," filed Nov. 4, 2015, all of which are incorporated herein by reference as if set forth in full.

BACKGROUND

1. Technical Field

The various embodiments described herein are related to application specific integrated circuits (ASICs), and more particularly to the design of various ASICs.

2. Related Art

Continuing advances in semiconductor device fabrication technology have yielded a steady decline in the size of process nodes. For example, 22 nanometer (nm) process nodes were introduced in 2012 but were quickly succeeded by 14 nm fin field-effect transistors (FinFETs) in 2014 while 5 nm process nodes are projected for 2020.

The decrease in process node size allows a growing number of intellectual property (IP) cores or IP blocks to be placed on a single ASIC chip. That is, modern ASIC designs often spread numerous process nodes across a comparatively large silicon die, and include combinations of IP blocks and logic functions. At the same time, modern technology also requires increased connectivity and large data transfers between various IP blocks. In addition, modern ASIC chips frequently include multiple clock domains in order to leverage multi-core implementations. Thus, one or more clock signals may need to be distributed across the chip in a manner that minimizes clock skew. For instance, the edge of the clock signal received at a logic block located near a clock source should be aligned with those received at more distant logic blocks.

Conventionally, a balanced clock signal distribution (i.e., timing closure) is achieved by inserting buffers. For example, pursuant to a traditional ASIC design flow, after floor planning and placing various IP blocks, a clock tree (i.e., a clock distribution network) may be synthesized and buffers may be added along the signal path from a clock source to various IP blocks according to the clock tree. In fact, timing closure for a clock signal that is distributed over a large and complex ASIC design typically requires the strategic placement of numerous buffers. Moreover, the distribution of a clock signal is also highly susceptible to both systematic and random variations. In particular, proper timing closure must account for the effects of on-chip variations that arise as a result of different process, voltage, and temperature (PVTs) and operation modes, which would otherwise introduce additional clock skews. As such, the most laborious and time consuming aspect of conventional ASIC design tends to be clock alignment. Clock tree synthesis and timing closure generally require significant manual intervention. In addition, the mechanisms (i.e., buffers) used to balance the clock across an ASIC chip generally consume a majority of the power in any conventional ASIC design.

Therefore, what is needed are an apparatus and method that overcome these significant problems found in the aforementioned conventional approach to ASIC design.

SUMMARY

Apparatuses and methods for ASIC design are provided.

According to various aspects, there is provided a point-to-point connection between a first intellectual property (IP) block and a second IP block of an application specific integrated circuit (ASIC). The point-to-point connection may comprise a transmitter (TX) associated with the first IP block, the TX comprising one or more delay insensitive (DI) encoders and one or more temporal compressors, and configured to transform input data signals to the first IP block into one or more temporally compressed DI asynchronous signals and transmit the temporally compressed DI asynchronous signals via a channel. The point-to-point connection may further comprise a receiver (RX) associated with the second IP block, the RX comprising one or more DI decoders, and configured to receive the one or more DI asynchronous signals via the channel and restore the one or more compressed DI asynchronous signals to form a representation of the input data signals compliant to an input data format of the second IP block; and wherein the channel is a timing independent channel between the first IP block and the second IP block, wherein the one or more DI asynchronous signals from the TX are propagated via the timing independent channel in a self-timed fashion to the RX.

According to various aspects, there is provided a point-to-multipoint connection between a first intellectual property (IP) block and a plurality of IP blocks. The point-to-multipoint connection may comprise a transmitter (TX) associated with the first IP block, the TX comprising one or more delay insensitive (DI) encoders and one or more temporal compressors, and configured to transform input data signals from the first IP block into temporally compressed DI asynchronous signals. The a point-to-multipoint connection may further comprise a timing independent channel between the TX and a Flow Control block, wherein the DI asynchronous signal from the TX is propagated via the timing independent channel in a self-timed fashion to the Flow Control block; the Flow Control block comprising a quasi-delay-insensitive (QDI) Flow Control element configured to broadcast or selectively propagate the compressed DI asynchronous signals to a plurality of individual timing independent channels; and multiple receivers (RXs) associated with receiving IP blocks, each RX comprising one or more DI decoders and one or more temporal decompressors, and configured to receive the DI asynchronous signals from the Flow control block and restore the compressed DI asynchronous signals received from the the Flow Control block to form duplicates of the input data signals.

According to various aspects, there is provided a multi-point-to-point connection between a transmitting Intellectual Property (IP) block and a plurality of receiving IP blocks. The multipoint-to-point connection may comprise a plurality of transmitters (TXs) each associated with respective transmitting IP blocks, each TX comprising one or more delay insensitive (DI) encoders and one or more temporal compressors, and configured to transform input data signals received from the transmitting IP blocks into temporally compressed DI asynchronous signals. The multipoint-to-point connection may further comprise a plurality of timing independent channels between the TXs and individual inputs of a Flow Control block, wherein the compressed DI asynchronous signals from the TXs are propagated via timing independent channels in a self-timed fashion to the Flow Control block; the Flow Control block comprising a QDI Flow Control element configured to merge or selectively propagate the individual timing independent channels; and a receiver (RX) associated with the receiving IP block, the RX comprising one or more DI decoders and one or more temporal decompressors, and configured to restore the compressed DI asynchronous signal received from the Flow Control block to form duplicates of the input data signals.

According to various aspects, there is provided a multi-point-to-multipoint connection between a plurality of transmitting IP blocks and a plurality of receiving IP blocks. The multipoint-to-multipoint connection may comprise a plurality of transmitters (TXs) each associated with a respective one of the transmitting IP blocks, each TX comprising one or more delay insensitive (DI) encoders and one or more temporal compressors, and configured to transform input data signals from the IP block into temporally compressed DI asynchronous signals. The multipoint-to-multipoint connection may further comprise timing independent channels between the TXs and individual inputs of a Flow Control block, wherein the DI asynchronous signals from the TXs are propagated via the timing independent channels in a self-timed fashion to the Flow Control block; the Flow Control block comprising a QDI Flow Control element configured to merge or selectively propagate the DI asynchronous signals to the individual timing independent channels; the QDI Flow Control element further configured to broadcast or selectively propagate the DI asynchronous signals to the individual timing independent channels; and multiple receivers (RXs) associated with the receiving IP blocks, each RX comprising one or more DI decoders and one or more temporal decompressors, and configured to receive the compressed DI asynchronous signals via the individual timing independent channels and restore the compressed DI asynchronous signal to form duplicates of the input data signals.

Other features and advantages of the present inventive concept should be apparent from the following description which illustrates by way of example aspects of the present inventive concept.

BRIEF DESCRIPTION OF THE DRAWINGS

The above and other aspects and features of the present inventive concept will be more apparent by describing example embodiments with reference to the accompanying drawings, in which:

FIG. 4*a* shows an exemplary Chronos Channel using Join or Merge blocks;

FIG. 4*b* shows an exemplary Chronos Channel using Fork or Steer blocks.

DETAILED DESCRIPTION

While certain embodiments are described, these embodiments are presented by way of example only, and are not intended to limit the scope of protection. The methods and systems described herein may be embodied in a variety of other forms. Furthermore, various omissions, substitutions, and changes in the form of the example methods and systems described herein may be made without departing from the scope of protection.

A Chronos Channel is an ASIC Interconnect that allows transmitter blocks to send data to receiver blocks. Chronos Channels stand out by relying on a reduced set of timing assumptions and being robust against delay variations. To do so, Chronos Channels transmit data using delay insensitive (DI) codes and quasi-delay-insensitive (QDI) logic. In this way, Chronos Channels are insensitive to all wire and gate delay variations, but for those belonging to a few specific forking logic paths called isochronic forks. Also, a unique characteristic of a Chronos Channel, when compared to related solutions, is that it uses temporal compression in its internal paths to reduce the overheads of QDI logic and efficiently transmit data. In fact, data can be compressed by different ratios, which can be any rational number (as long as a technology specific maximum frequency restriction is respected). In this way, a Chronos Channel is defined by the combination of a DI code (and related handshake protocol), a temporal compression ratio and the hardware required to encode, decode, compress, decompress and transmit data.

DI codes are a specific family of encoding schemes where no codeword can be contained in another codeword. This allows a receiver to perceive the transmission of a codeword unambiguously. Such a characteristic eliminates the need for a control signal that identifies the validity of a data channel, and its respective timing assumptions (as in synchronous or bundled-data asynchronous design), as the validity of the data channel is encoded in the data itself. Also, note that, usually, DI codes are employed in digital applications, which means that their code words are typically defined using a set of binary values. However, in a Chronos Channel, signals do not need to be digital and codewords can be represented using sets with more than 2 values, provided that data is still encoded using a DI code. In other words, the data in a Chronos Channel can be composed of analog signals, as long as no codeword is contained in another codeword. Such a characteristic allows a more flexible usage of Chronos Channels. Another aspect of DI codes is that, to allow data transmission, they are usually coupled to a handshake protocol, which is usually 4- or 2-phases.

Figure 3A:
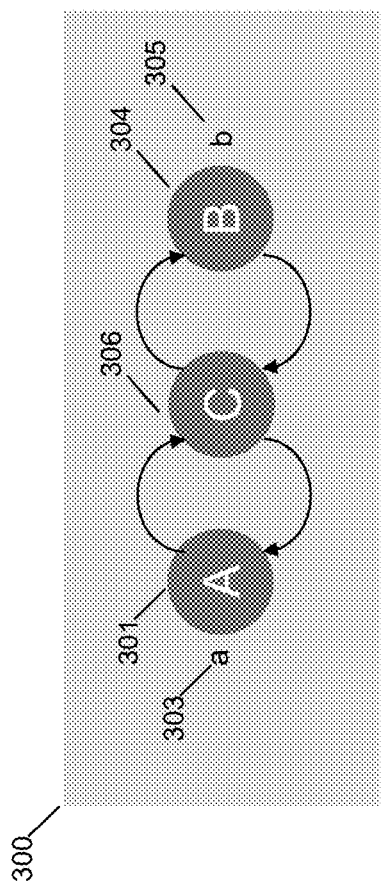
FIG. 3*a* represents a Chronos Robust flow graph.

A large variety of DI codes are available in the state-of-the-art. One example of DI encoding schemes for Chronos Channels is the Chronos-Robust encoding scheme, a flowchart of which is illustrated in FIG. 3*a*. In this scheme 300, the decoded data is represented by the set of symbols (a,b) and the encoded data by (A, B, C). For transmitting data using this encoding scheme, whenever codeword "A" 301 is detected in the channel, one can safely identify that a value "a" 303 is in the channel. The same is valid whenever a codeword "B" 304 is detected and one can safely identify a value "b" 305. However, to allow data transmission there is always the transmission of an empty codeword "C" 306 between every valid codeword ("A" or "B"). This allows a receiver to detect sequences of "A"s or "B"s unambiguously. In this case, a 4-phase handshake is established and the protocol for transmitting data is: (i) the sender issues a valid codeword; (ii) the receiver acknowledges the valid codeword; (iii) the sender issues a spacer; and (iv) the receiver acknowledges the spacer. As an example, one can have a 1 bit binary data (a=0, b=1) being encoded using 2 bits binary codewords (A=01, B=10, C=00). Note that, by using this scheme, one can safely identify transitions between "a" and "b". As another example, one can have the same 1 bit binary data (a=0, b=1) being encoded using a single analog signal (A=0V, B=1V, C=0.5V).

Figure 3C:
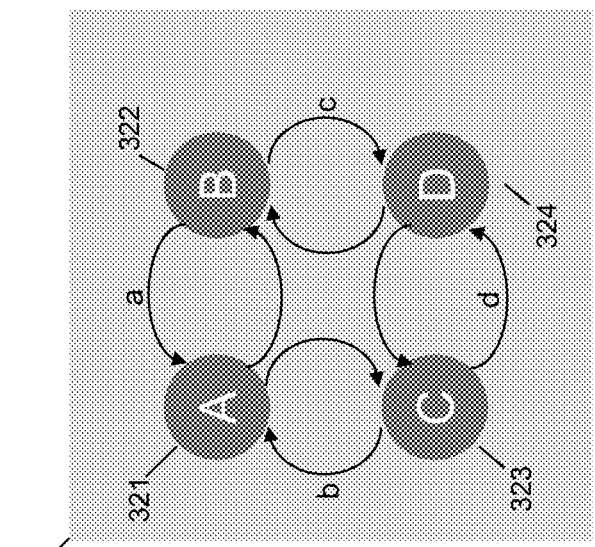
FIG. 3*c* represents a Chronos Dense flow graph.
Figure 3B:
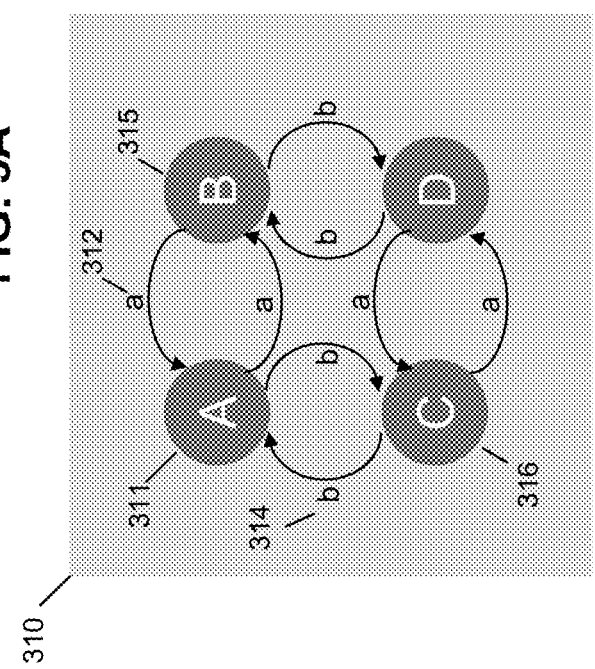
FIG. 3*b* represents a Chronos Robust Low Power flow graph.

Another example of DI encoding scheme for a Chronos Channel is the Chronos-Robust Low Power encoding scheme, a flowchart of which is illustrated in FIG. 3*b*. In this scheme, 310, decoded data is represented by (a,b) and encoded data by (A, B, C, D). For transmitting data using this encoding scheme, it is not enough to analyze the current codeword to detect the respective value. For example, codeword "A" 311 may represent either an "a" 312 or a "b" 314 value, depending if the previous codeword was "B" 315 or "C" 316, respectively. In this case, where one can only detect a value analyzing transitions, rather than codewords, a 2-phase handshake protocol is required: (i) the sender issues a new codeword; (ii) the receiver acknowledges the codeword; As an example, one can have a 1 bit binary data (a=0, b=1) being encoded using 2 bits binary codewords (A=00, B=01, C=10, D=11). Note that, by using this scheme, one can safely identify "a" values whenever there is a transition in the least significant bit of the codewords and "b" values whenever there is a transition in the most significant bit of the codewords. Compared to the Chronos Robust encoding scheme this encoding scheme reduces the number of transitions leading to lower switching power.

A Chronos Robust Dense encoding scheme illustrated in FIG. 3*c* is another DI encoding scheme, where decoded data is represented by the set (a, b, c, d) and encoded data by (A, B, C, D). In this encoding scheme 320, it is also not enough to analyze the current codeword to detect the respective value. In this encoding scheme a value is detected by analyzing transitions, rather than codewords. However, differently from the Chronos Robust Low Power example, data detection always requires 2 transitions, one to issue a pre-valid codeword (B 322 or C 323) and one to issue a valid codeword (A 321 or D 324). Therefore, a 4-phase handshake protocol is required: (i) the sender issues a new pre-valid codeword; (ii) the receiver acknowledges the pre-valid codeword; (iii) the sender issues a new codeword; and (iv) the receiver acknowledges the new codeword. As an example, one can have a 2 bit binary data (a=00, b=01, c=10, d=11) being encoded using 2 bits binary codewords (A=00, B=01, C=10, D=11). Note that, by using this encoding scheme, one can safely identify valid data such that: (i) "a": whenever there is a transition to B followed by a transition to A; (ii) "b": whenever there is a transition to C followed by a transition to A; (iii) "c": whenever there is a transition to B followed by a transition to D; and (iv) "d": whenever there is a transition to C followed by a transition to D. A possible application of the Chronos Robust Dense encoding scheme is data encryption or data correction.

Chronos Channels do not have a global clock signal, hence their basic performance cannot be defined as an operating frequency, but rather as a cycle time. In such channels, the cycle time is defined as the time between two consecutive transactions when the Channel is always transmitting data. In other words, the cycle time of a Chronos Channel dictates how fast it can consume the data of a producer and how fast it will generate data to a consumer. For example, assuming that the cycle time of a Chronos Channel is 1 ns, a producer can generate a new data every 1 ns (or operate at an equivalent frequency of 1 GHz) and safely assume that every new piece of data it generates will be consumed by the Chronos Channel. Similarly, in this case, a consumer can expect to receive a new data every 1 ns from the channel. Hence, it can also sample data at an equivalent frequency of 1 GHz. Note, however, that Chronos Channels do not have any assumption of possible clock signals used in producers and consumers connected to them, as they employ synchronizers in their control path interfaces.

Another performance metric of a Chronos Channel is its latency, or the time it takes for data being available in its inputs to being transmitted to its outputs. Note that, depending on the spatial distribution of the Chronos Channel in the physical implementation of the circuit, its latency can grow, due to long wiring. Although it is unavoidable to increase the latency as the length of wires increase, the impact on cycle time can be mitigated (or even avoided) by adding repeater stages, which are like pipeline stages. In this way, a long link may exhibit an increased latency but cycle time can remain the same. In other words, it can take some cycles for the data to propagate through the Chronos Channel. However, the producer will still be able to inject new data at every cycle time and the consumer can still expect a new data at every cycle time. The notion of the cycle time and latency of a Chronos Channel is important to understand the different possibilities of temporal compression that can be adopted for these channels.

In a Chronos Channel, the temporal compression ratio determines the number of slots in which a cycle time will be divided. This allows distributing temporally the data to be transmitted and reducing hardware overhead because the different slots can be propagated by sequentially using the same hardware. In other words, the temporal compression ratio defines how many pieces the data will be split into in order to be serially transmitted through the Chronos Channel. This ratio can be defined as any positive rational number and is only constrained by the maximum frequency allowed by a target technology. For example, assuming a cycle time of 1 ns, a compression ratio of 2 means that the data to be transmitted will be split in two pieces of data, each with a 0.5 ns slot of the total cycle time. In this way, the circuit implemented in the Chronos Channel needs to guarantee that each piece of data can be transmitted in 0.5 ns to ensure a 1 ns cycle time. Note that, for higher temporal compression ratios, this cycle time is reduced, in such a way that the maximum ratio possible is limited by the maximum ratio allowed by the target technology (or the minimum delay for a single slot).

Figure 1:
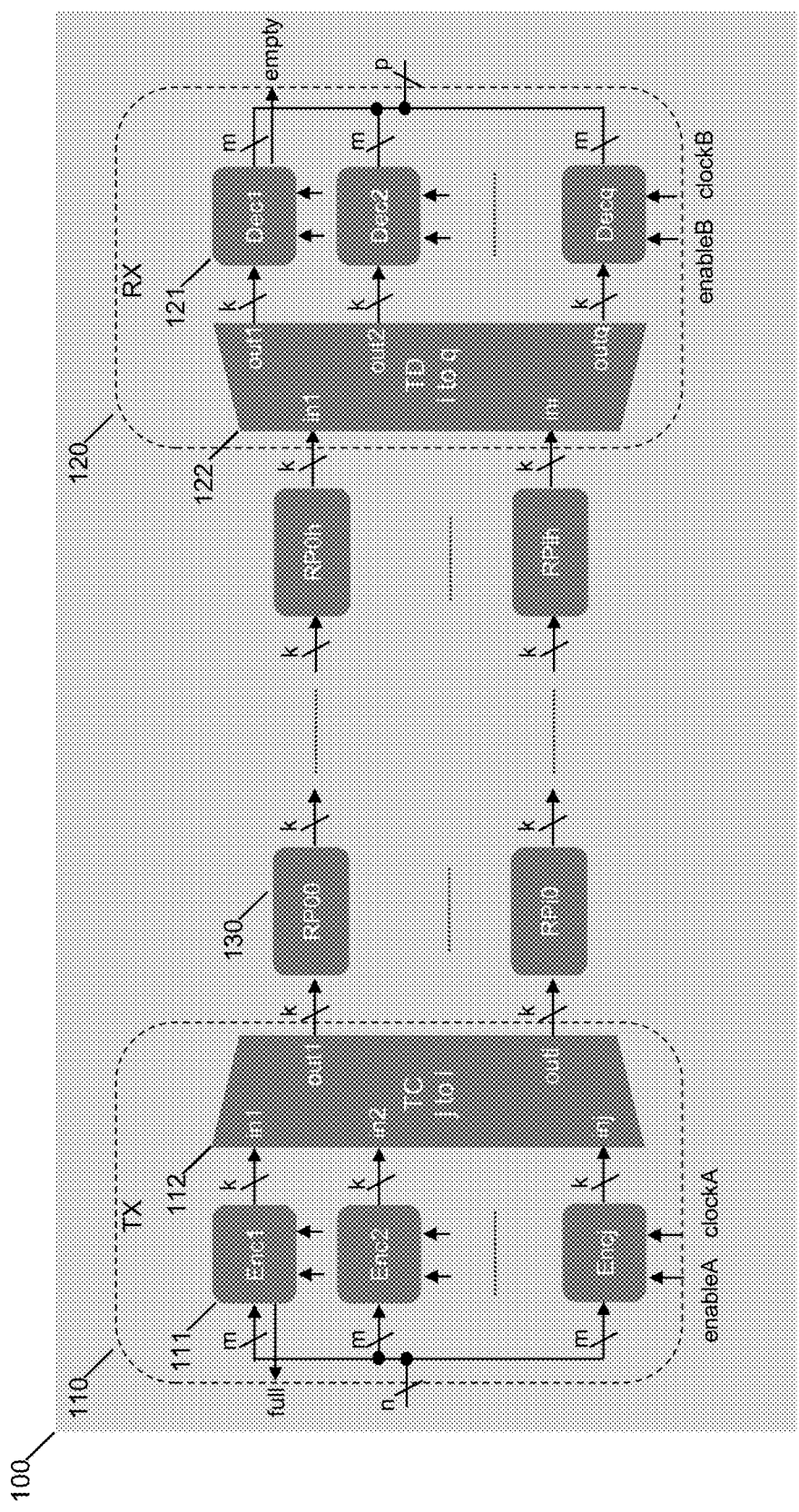
FIG. 1 is a general block diagram illustrating a possible embodiment of a generic Chronos Channel implementation.

To implement a Chronos Channel in a target technology, different circuits can be employed. FIG. 1 shows a block diagram of a possible embodiment of a generic Chronos Channel implementation with the general hardware organization, in various embodiments, to explore the functionality of these circuits. In this hardware organization 100 there are 5 main components: encoders (Enc) 111; temporal compressors (TC) 112; repeaters (RP) 130; temporal decompressors (TD) 122; and decoders (Dec) 121.

An encoder 111 is responsible for transforming the input data (e.g., input data received from a producer IP block to be transmitted to a consumer IP block), which is represented using "m" wires, into encoded data that uses "k" wires and a specific DI code. A Chronos Channel requires "j" encoders 111, where "j" is the size of the input data divided by the size of the DI code of choice. Also, encoder blocks 111 may require input control signals to indicate the validity of the data in their inputs. A clock signal (clockA) can be used for synchronous data inputs and an enable signal (enableA) can be used to enable or disable data consumption in order to fulfil specific data transmission protocol requirements. These encoder blocks 111 also generate an output control signal to indicate when the Chronos Channel is full and cannot accept new data. Note that data in either the inputs or the outputs of an encoder 111 can be digital or analog.

The TC 112 splits a "j" sized set of encoded data in "j/i" (or the temporal compression ratio) "i" sized sets of encoded data. Then, the TC 112 issues each of the "j/i" sets in its outputs, one at a time. To control the flow of this data, the handshake protocol defined by the choice of DI code is used. Note that the maximum time to transmit each of the "j/i" sets is the delay of the slot defined by the target cycle time divided by the compression ratio. In this way, and assuming that the remaining parts of the circuit will also be able to consume the data while guaranteeing cycle time performance, all the "j/i" sets will be sent in one cycle time. The outputs of the TC 112 can feed either a repeater 130 or the TD 122 directly. Also, note that in case "j/i" is not a natural number, but rather a positive rational number, the TC 112 will use only the required number of its outputs in the transmission of the last slots of data. Nevertheless, the division of the cycle time in slots will still be a natural number defined as the ceiling function of "j/i".

Repeaters 130 have memory elements and are capable of holding encoded data and sending it to a next repeater or the TD 122. To control the flow of this data, the handshake protocol defined by the choice of DI code is used. Furthermore, the maximum time to transmit each of the "j/i" sets is also the delay of the slot defined by the target cycle time divided by the compression ratio. Note that repeaters 130 may or may not be required in a Chronos Channel, as they are used to fix slot delay violations in long paths that fail to meet cycle time requirements or to improve signal strength. Also, note that different numbers of repeaters 130 may be required for the different outputs of a TC 112. This is valid because, in a Chronos Channel, there is no global control signal dictating how events flow through the data path. Rather, each path from an output of a TC 112 to the input of a TD 122 has an independent flow control. Again, the only restriction is the specified cycle time.

The TD 122 merges "q/i" sets of encoded data, each with size "i", in a single set of encoded data with size "q". Then the TD 122 issues the whole "q" sized set in its outputs, which feed the decoder blocks 121. To control the flow of this data, the handshake protocol defined by the choice of DI code is used. In this circuit, the maximum time to consume each of the "q/i" sets is the delay of the slot defined by the target cycle time divided by its compression ratio. Note that, in some embodiments, TDs 122 can have a different compression ratio than that of the TC 112 and can generate sets with a different size from those originally consumed by the TC 112. This is particularly useful when connecting transmitters and receivers with different clock frequencies. Also, if the compression ratio of the TD 122 is a positive rational number, it will only use the required number of its inputs in the consumption of the last slots of data.

The decoder 121 is responsible for transforming input encoded data, which is represented using "k" wires and a specific DI code, back to the original input data that used "m" wires. In various embodiments, the decoder 121 is configured to transform the input encoded data to form a representation of the data signals input to the encoders 111, the representation being compliant to an input data format of the consumer IP block. To decode data, a Chronos Channel needs "q" decoders, as defined in the compression ratio of the TD 133. A decoder block may also require input control signals to indicate that data in its outputs was successfully collected. To do so, a clock signal (clockB) can be used, for synchronous data outputs, and an enable signal (enableB) can be used to enable or disable the generation of new data in the outputs of the Chronos Channel, to fulfil specific data transmission protocol requirements. Furthermore, decoders 121 also generate an output control signal to indicate when they are empty, which means there is no data in the Chronos Channel to be consumed. Note that data in either the inputs or the outputs of a decoder 121 can be digital or analog.

Another important concept in a Chronos Channel is the definition of TX and RX blocks. As FIG. 1 shows, TX 110 is the block that comprises the encoders 111 and TC 112 of the channel and RX 120 is the block that comprises the decoders 121 and TD 122 of the channel. In this way, the control signals connected to the TX 110 (enableA, clockA and full) must be produced and consumed by the transmitter connected to the Chronos Channel, whenever applicable. This means that the clock connected to the TX 110 (clockA) must be the same clock connected to the transmitter, assuming that the transmitter is synchronous. The same is valid for the input and output control signals of the TX 110 (enableA and valid), they must be respectively produced and consumed by the transmitter. In a similar way, the control signals of the RX 120 (enableB, clockB and empty) must be produced and consumed by the receiver connected to the Chronos Channel.

Due to the asynchronous communication between TX and RX blocks 110 and 120, a Chronos Channel can interface transmitters and receivers that operate at different frequencies and with different data bus widths (as the compression ratios can be different in the TX and RX blocks 110 and 120). However, to avoid data loss, it must be ensured that the receiver consumes data as fast as the producer generates new data. To do so, the output throughput must be greater or equal to the input throughput. More specifically, recalling FIG. 1: $FB*p \geq FA*n$, where FB is the frequency of clockB and FA is the frequency of clockA.

The usage of controllers coupled to the TX 110 and RX 120 can enable avoiding the requirement of constrained frequencies between transmitter and receiver blocks. Such controllers must be able to implement a communication protocol using the control signals provided by the TX and RX blocks 110 and 120. Note that these signals allow implementing a variety of communication protocols, such as (and not limited to) handshake- or credit-based protocols. The coupling of controllers to a Chronos Channel generates what is called a Chronos Link, and enables leveraging the full flexibility of Chronos Channels. This is because transmitters and receivers connected to Chronos Links can be completely asynchronous to each other and communication may be established by a handshake procedure without any need to perform complex timing closure. An example of such an implementation is given in patent application Ser. No. 15/344,420.

Figure 2A:
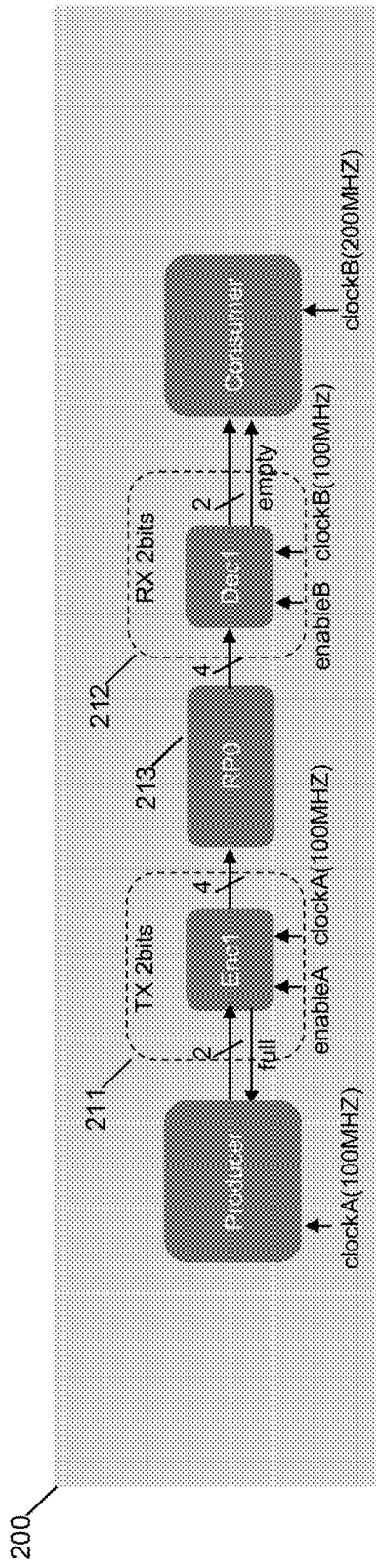
FIG. 2*a* is an example of a 2 bits Chronos Channel.

FIG. 2a is a block diagram of a 2 bits Chronos Channel illustrating a point-to-point connection 200 from a transmitter (TX 211) operating at 100 MHz and sending digital data with a width of 2 bits to a receiver (RX 212) operating at 100

MHz and receiving digital data with a width of 2 bits. The employed TX 211 block and the RX 212 block both have a temporal compression ratio of 1 and, therefore, their TC and decompressor blocks can be omitted. Furthermore, in this example, data within the Chronos Channel is encoded using a digital 1-of-4 DI code, and requires 4 wires for each 2 bits of decoded data. In this example, one repeater 213 is enough to guarantee throughput and signal strength requirements.

Figure 2B:
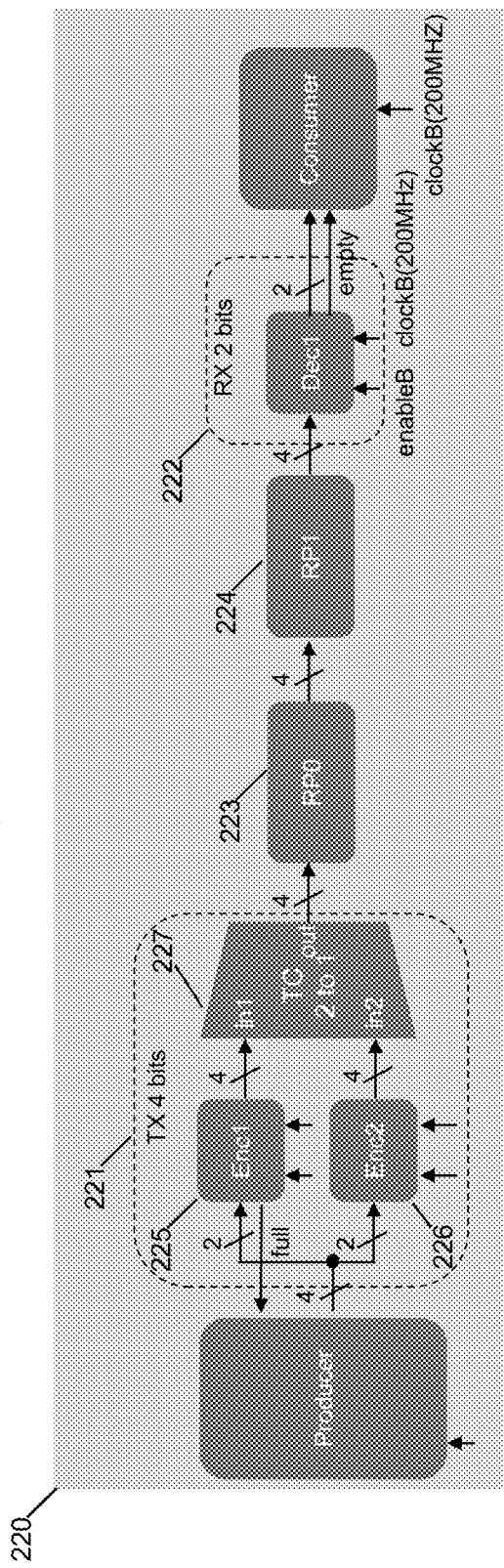
FIG. 2*b* is an example of a 4 bits Chronos Channel.

FIG. 2b is a block diagram of a 4 bits Chronos Channel illustrating a point-to-point connection 220 from a transmitter (TX 221) operating at 100 MHz and sending digital data with a width of 4 bits to a receiver (RX 222) operating at 200 MHz and receiving digital data with a width of 2 bits. To accommodate the discrepancy between the input and the output data widths while maintaining throughput, the TX 221 has a temporal compression ratio of 2 and the RX 222 has a temporal ratio of 1. In this example, data within the Chronos Channel is also encoded using a digital 1-of-4 DI code, and requires 4 wires for each 2 bits of decoded data. Also, two repeaters 223 and 224 are used to guarantee throughput and signal strength requirements. Note that, because the compression ratio in the RX 222 is 1, a single decoder (Dec1) is used. However, because the compression ratio in the TX 221 is 2, the 4 bits input data is split in two 2 bits buses that are connected to 2 encoders 225 and 226 that generate data using a 1-of-4 DI code. The generated data is the input to a 2 to 1 TC 227 that issues the data of one input at a time in its output, which is also encoded using a 1-of-4 DI code.

Figure 2C:
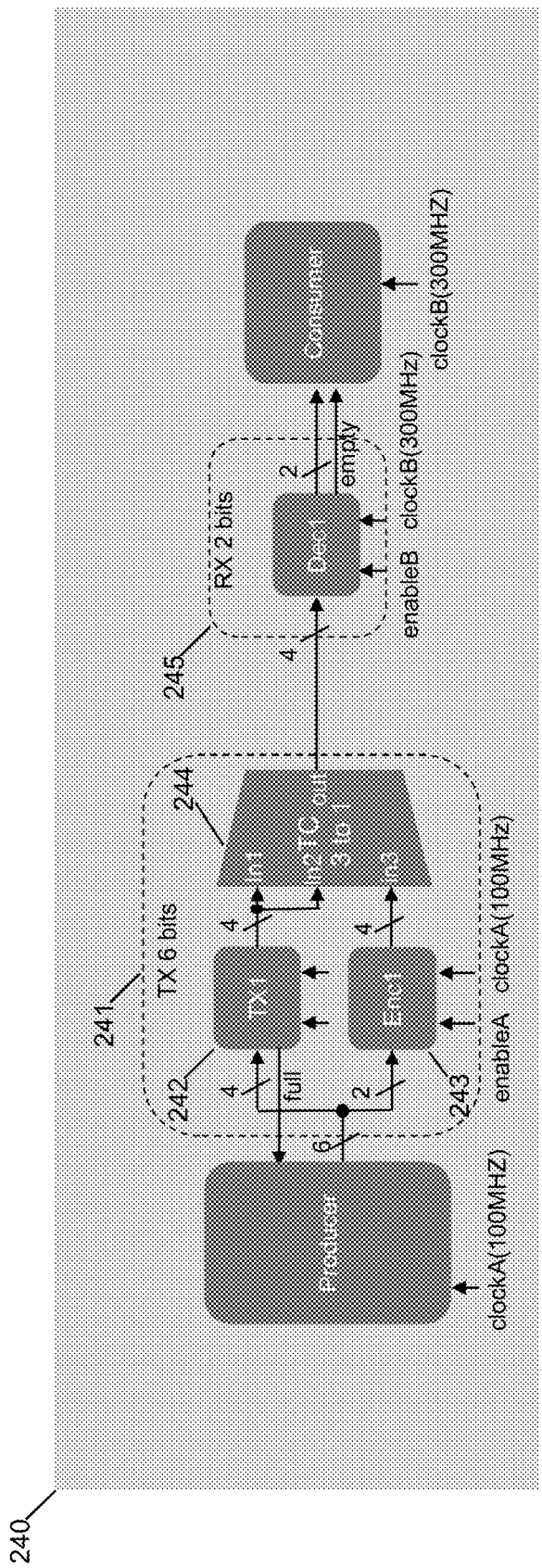
FIG. 2*c* is an example of a 6 bits Chronos Channel.

FIG. 2c is a block diagram of a 6 bits Chronos Channel illustrating a point-to-point connection 240 from a transmitter (TX 241) operating at 100 MHz and sending digital data with a width of 6 bits to a receiver (RX 245) operating at 300 MHz and receiving digital data with a width of 2 bits. To accommodate the discrepancy between the input and the output data widths while maintaining throughput, the TX 241 has a temporal compression ratio of 3 and the RX 245 has a ratio of 1. Furthermore, this example demonstrates how TXs can be nested to allow more flexible and modular design of Chronos Channels, as the input data is divided in two buses, with widths of 4 and 2 bits. The bus of 4 bits is input to the nested TX 242, which can be the same implementation described in reference to TX 221 in FIG. 2b. In this way, TX 242 encodes the data using a 1-of-4 DI code and divides it in two temporal slots, sending one at a time in its output. The TX 242 output is then connected to the first two inputs of the 3 to 1 TC 244 shown in FIG. 2c. The third input of the TC 244 is connected to an encoder 243 that generates data using the same 1-of-4 DI codes used in the nested TX1 242. The TC 244 will then issue the three inputs one at a time to an output, which is directly connected to the RX 245. Note that in this example there is no need for repeaters between the TX and RX blocks.

Figure 2D:
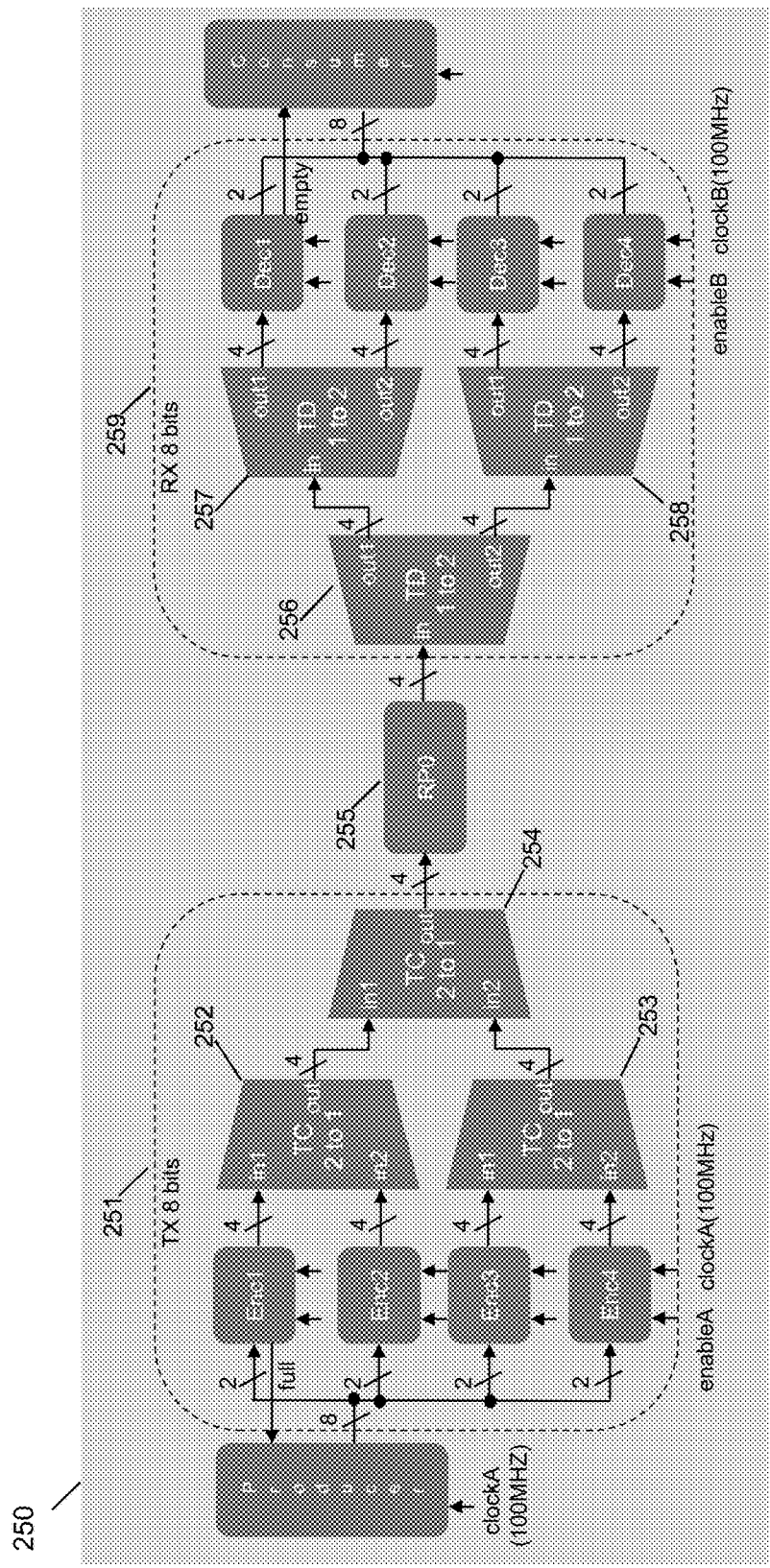
FIG. 2*d* is an example of an 8 bits Chronos Channel.

FIG. 2d is a block diagram of an 8 bits Chronos Channel illustrating a point-to-point connection 250 from a transmitter (TX 251) operating at 100 MHz and sending digital data with a width of 8 bits to a receiver (RX 259) operating at 100 MHz and receiving digital data with a width of 8 bits. In this example, the TX 251 and RX 259 have the same throughput, requiring the same temporal compression ratio (in this case 4). Also, this example shows how TCs and decompressors can be arranged in tree structures, as they are associative. In the TX block 251, 4 encoders (End, Enc2, Enc3 and Enc4) encode data using a 1-of-4 DI code and two pairs of encoders, with each pair of encoders being connected to one of two 2 to 1 TCs 252 and 253. The TCs 252 and 253 are then connected to another TC 254. In this example, a single repeater 255 between the TX 251 and RX 259 blocks is used to fulfil throughput requirements. In the RX 259, TDs 256, 257 and 258 are organized in a tree structure where a single 1 to 2 TD 256 has its outputs connected to two other TDs 257 and 258. These TDs 256, 257 and 258, in turn, are connected to 4 decoders (Dec1, Dec2, Dec3 and Dec4) to decode the 1-of-4 DI data back to 8 bits digital data. In various embodiments, the decoders Dec1, Dec2, Dec3 and Dec4 are configured to transform encoded data input to the decoders to form a representation of data signals generated by a producer IP block and input to the encoders Enc1, Enc2, Enc3 and Enc4, the representation being compliant to an input data format of the consumer IP block.

FIG. 4a shows a block diagram of an exemplary Chronos Channel using Join or Merge blocks in a multi-point-to-point connection 400 according to various embodiments. Referring to FIG. 4a, in various embodiments, a multi-point-to-point connection 400 may serve as a connection between two producer IP blocks and a third consumer IP block. The producer IPs are connected to respective inputs of TXs 401 and 402 (and subsequently to inputs of two repeaters RP0 and RP1 in this example), thereby generating two independent paths in the Chronos Channel. These paths can then be combined using a flow control block 403, which can be (but are not limited to) a merge, a join or a select component, depending of the control flow requirements. For example, a merge component combines the information of both paths into a single output path, while a select or a join component can arbitrate between paths using some control mechanism. The output of the control flow block 403 will be propagated to the inputs of an RX block 404 via a third repeater RP2 in this example. Note that repeaters RP0, RP1 and RP2 can be added in any point between TXs 401 and 402 and RX 404, including before and after the flow control block 403.

FIG. 4b shows a block diagram of an exemplary Chronos Channel using Fork or Steer blocks in a point-to-multi-point connection 420 according to various embodiments. Referring to FIG. 4b, in various embodiments, the point-to-multi-point connection 420 may serve as a connection between a producer IP block and two consumer IP blocks. The producer IP is connected to an input of TX 421 (and a repeater RP0 in this example) and the generated path in the Chronos Channel can be divided using a flow control block 422, which can be (but is not limited to) a fork or a steer component, depending on the flow control requirements. For example, a fork component sends the same input information to both output paths, while a steer component can arbitrate to send different input information to each of the output paths using some control mechanism. The outputs of the control flow block 422 are propagated to inputs of RX blocks 423 and 424. Note that repeaters RP0, RP1 and RP2 can be added in any point between the TX 421 and the RXs 423 and 424, including before and after the flow control block 422.

Figure 4C:
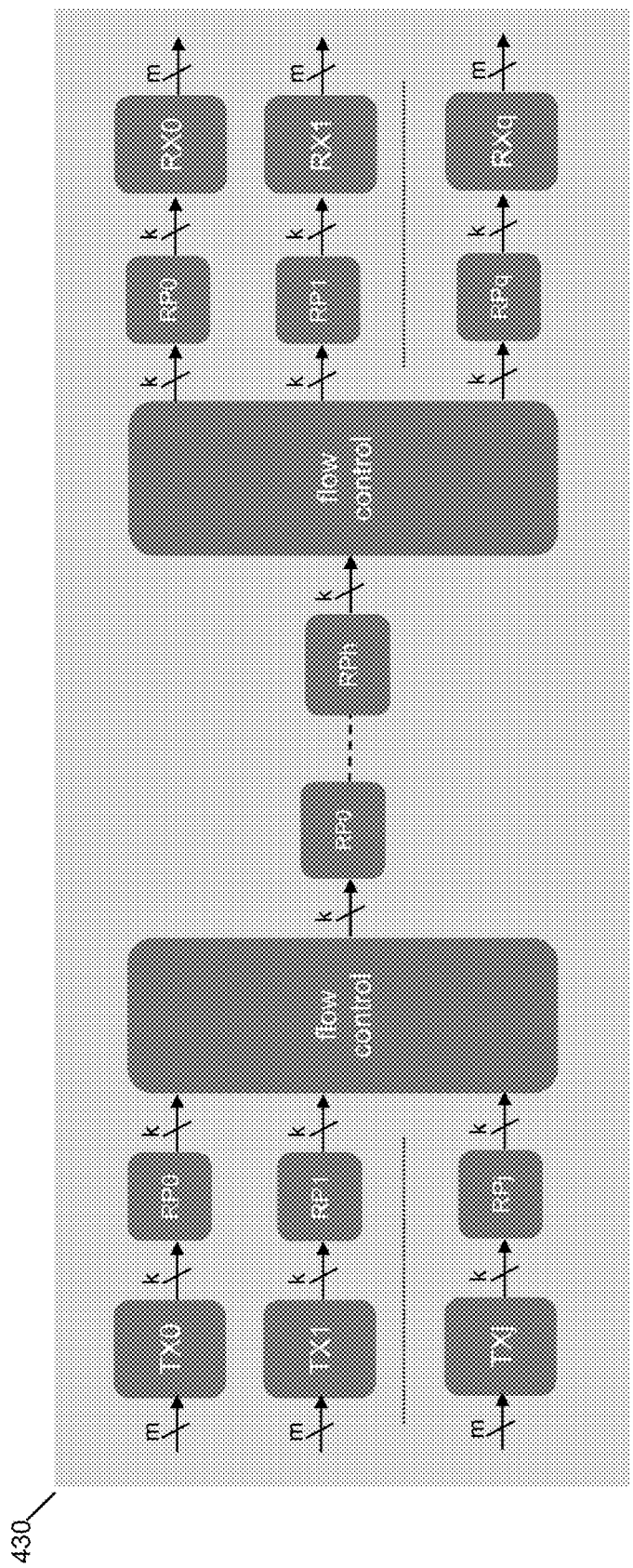
FIG. 4*c* shows an exemplary Chronos Channel using Join, Merge, Fork and Steer blocks.

FIG. 4c shows a block diagram of an exemplary Chronos Channel using Join, Merge, Fork and Steer blocks illustrating a multi-point-to-multi-point connection 430 according to various embodiments. Referring to FIG. 4c, in various embodiments, the multi-point-to-multi-point connection 430 may serve as a connection between a set of producer IP blocks and a set of consumer IP blocks. Each producer IP block is connected to one of j TXs (TX0, TX1 to TXj), each which generates an independent path in the Chronos Channel. These independent paths can then be combined using different combinations of flow control blocks and any number of repeaters (RP0 to RPh) to implement a specific functionality. The combined paths are received at another set of flow control blocks and forwarded via repeaters (RP0, RP1 to RPq in this example) to receivers RX0, RX1 to RXq. In the end of each path in the Chronos Channel, the RXs are interfaced with the consumer IPs. Note that between the TXs (TX0, TX1 to TXj) and the RXs (RX0, RX1 to RXq), different combinations of flow control blocks and repeaters can be employed, to fulfil functional and performance requirements.

All the logic used to implement the components of a Chronos Channel must be QDI. This requirement is to ensure the robustness of such channels and to guarantee that synchronization and control of events inside a Chronos Channel are all performed asynchronously. This allows timing independent channels to be established between IP blocks in an ASIC design. In this way, timing closure for the ASIC design may be accomplished with simplified, top level checks. That is, testing each individual IP block in the ASIC design across all corners (i.e., PVT) obviates any complex timing margin evaluation for the ASIC design as a whole. In various embodiments, a timing independent channel between two or more IP blocks may include one or more repeaters, which can improve signal strength and throughput. In various embodiments, repeaters may be inserted on the basis of distance between IP blocks, which can be determined beforehand.

Advantageously, a Chronos Channel included in an ASIC design renders the ASIC design insensitive to PVT variations and resilient to aging. Due to the absence of a clock, the ASIC design also consumes less power. The ASIC design also exhibits low electromagnetic interference (EMI) as a result of the self-timed nature of the circuits as well as low leakage. Consequently, the ASIC design may be especially ideal for large area ASICs where routing (i.e., of the clock signal) is difficult and significant effort is traditionally expended in synthesizing a clock tree to balance the skew across corners and modes of operation.

In various embodiments, each IP block may be associated with a liberty (i.e., .lib) file describing the timing and power parameters for the block in a particular technology across a range of operation modes. Moreover, each IP block may also be associated with an abstract view, which contains the IP physical boundary as well as the location of each pin. A top level netlist may describe the connections between different IP blocks. In addition, information on different clock domains should also be available. The foregoing information may serve as inputs into a Chronos Channel generation process.

Figure 5:
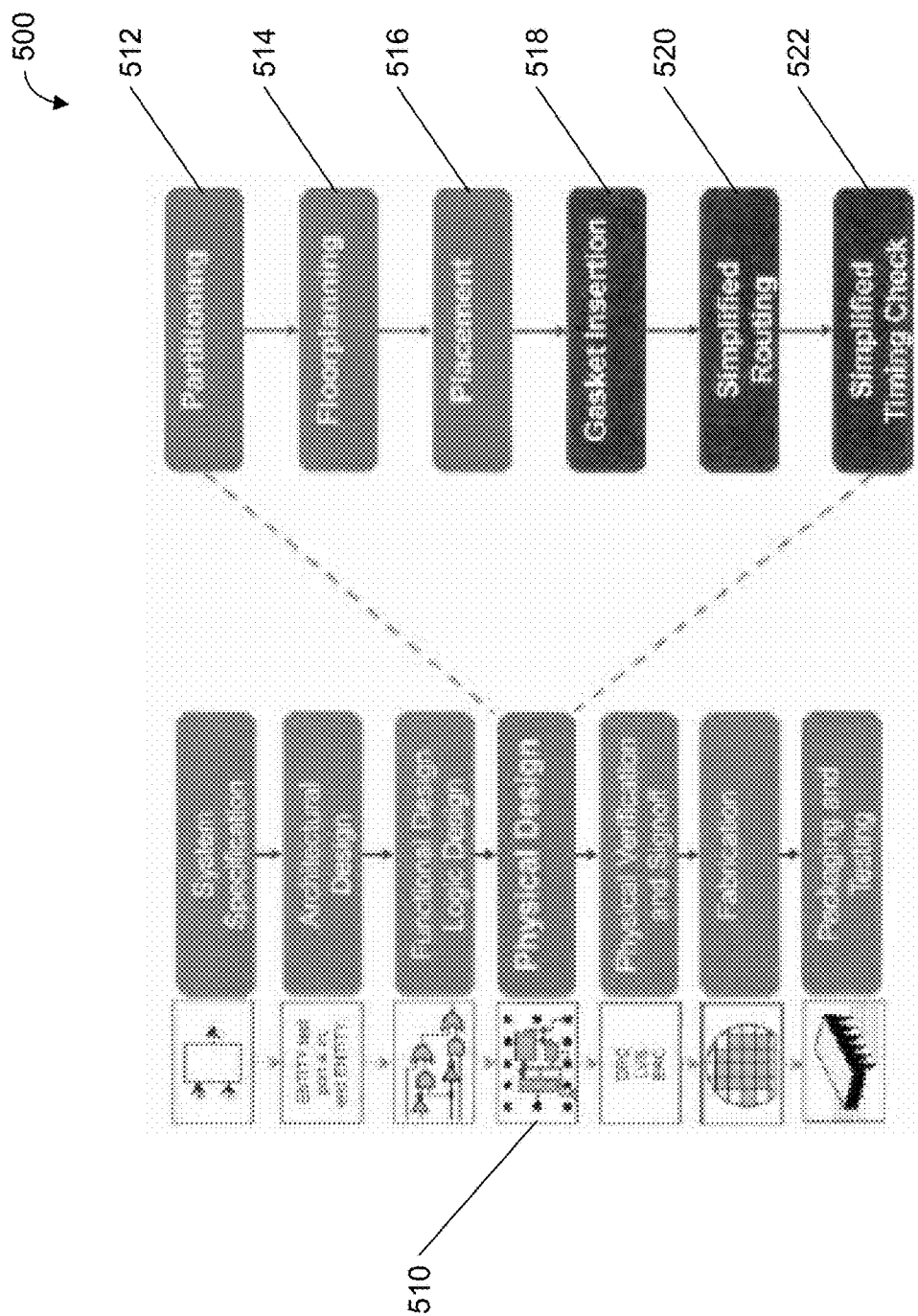
FIG. 5 is a flowchart illustrating a process for ASIC design according to various embodiments.

FIG. 5 is a flowchart illustrating a process 500 for ASIC design according to various embodiments. Referring to FIG. 5, in various embodiments, the process 500 includes a physical design step 510. In various embodiments, the physical design step 510 may include partitioning 512, floorplanning 514, placement 516, gasket insertion 518, simplified routing 520, and simplified timing check 522.

In various embodiments, gasket insertion 518 replaces clock tree synthesis, which could be performed as part of the physical design step in a conventional ASIC design flow (e.g., a conventional ASIC design flow). According to one exemplary embodiment, gasket insertion 518 communication between various IP blocks uses self-timed as opposed to synchronous signals. Gasket insertion 518 includes inserting one or more gaskets (i.e., a transmitter gasket and/or a receiver gasket) for each IP block in an ASIC design. The gaskets transform a signal between two IP blocks from a synchronous signal to an asynchronous self-timed signal with a handshake between the IP blocks.

In various embodiments, simplified signal routing 520 replaces conventional signal routing. The gaskets afford independence from any timing constraints. Consequently, connections between various IP blocks may be easily established. One or more asynchronous buffers (Abufs) may be inserted as a repeater between distantly located IP blocks in order to improve signal strength and throughput. Nevertheless, Abufs are inserted based on the distance between IP blocks and not based on any process, voltage and temperature (PVT) conditions or operation mode variations.

In various embodiments, simplified timing check 522 replaces timing closure, which may be performed as part of the physical design step in a conventional ASIC design flow. The use of gaskets obviates a substantial need to evaluate timing margins across PVT corners. Most PVT and operation mode variations are accounted for by the asynchronous protocol. In various embodiments, the simplified timing check 522 includes verification of a small subset (e.g., approximate 10%) of slow corners.

In various embodiments, each IP block may be associated with a liberty (i.e., .lib) file describing the timing and power parameters for the block in a particular technology across a range of operation modes. Moreover, each IP block may also be associated with an abstract view, which contains the IP physical boundary as well as the location of each pin. A top level netlist may describe the connection between different IP blocks. In addition, information on different clock domains should also be available. The foregoing information may serve as inputs into a gasket generation process.

Figure 6:
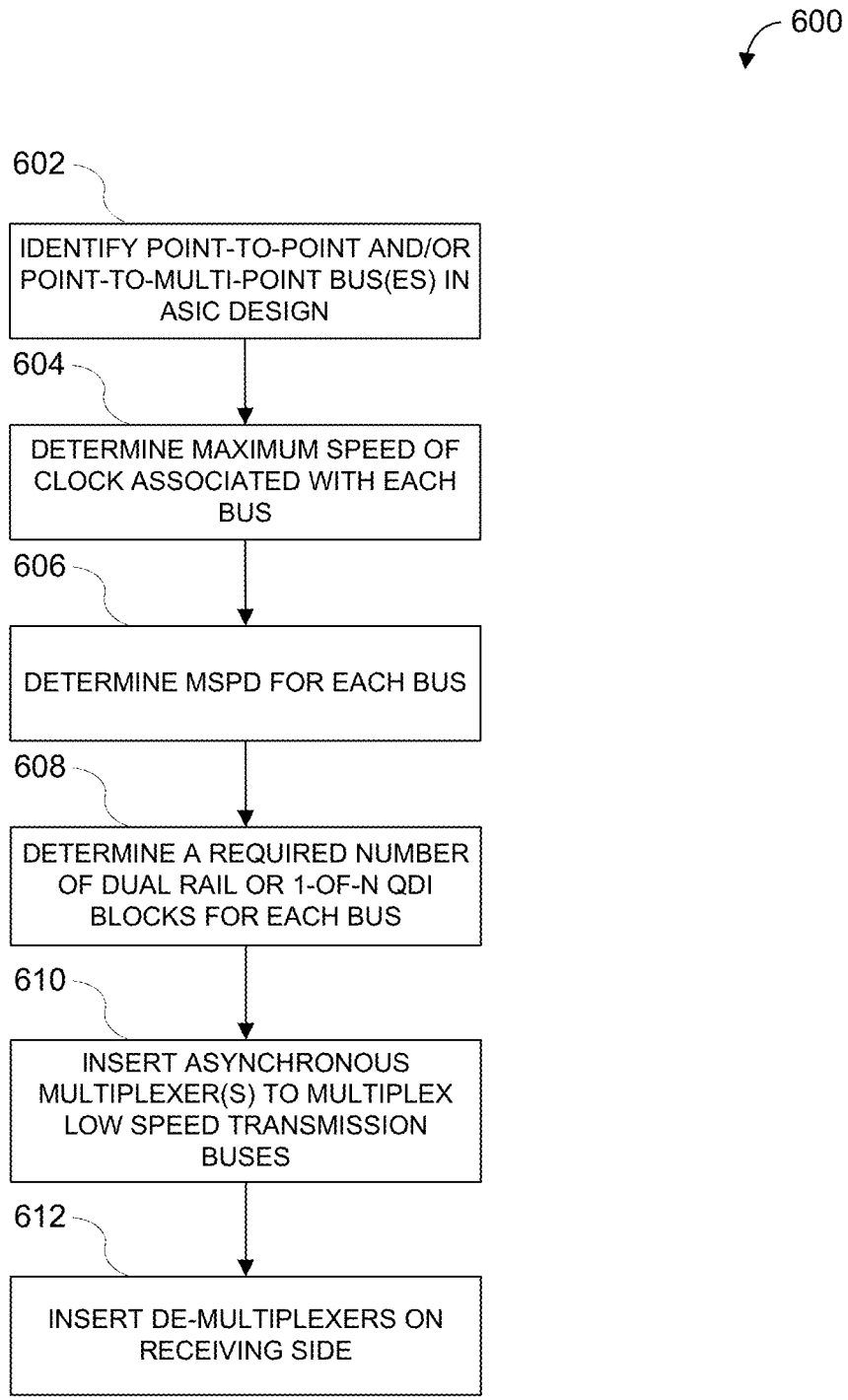
FIG. 6 is a flowchart illustrating a process for gasket generation according to various embodiments.

FIG. 6 is a flowchart illustrating a process 600 for gasket generation according to various embodiments. Referring to FIGS. 5 and 6, in various embodiments, the process 600 may implement gasket insertion 518.

In various embodiments, one or more point-to-point buses (e.g., one of the point-to-point connections 200, 220 or 240) and/or point-to-multi-point buses (e.g., the point-to-multi-point connection 420) and/or multi-point-to-point buses (e.g., the multi-point-to-point connection 400) and/or multi-point-to-multi-point buses (e.g., the multi-point-to-multi-point connection 430) are identified in an ASIC design (602). The maximum speed of a clock associated with each bus is determined (604). For example, buses may include output signals from one IP block to one or more other IP blocks.

The maximum speed of the clock associated with each bus corresponds to a maximum equivalent speed in an asynchronous domain for a given technology (i.e., MSPD). As such, the MSPD for each bus is determined (606).

A required number of dual-rail or 1-of-n QDI blocks (i.e., encoders and decoders) is determined based on the MSPD for each bus (608). The transmitter and receiver gaskets for each bus may include the same number of dual-rail or 1-of-n QDI blocks. In various embodiments, a dual-rail or 1-of-n QDI implementation guarantees delay insensitivity in the timing independent channels between IP blocks in the ASIC design.

One or more asynchronous multiplexers may be inserted to multiplex low speed transmission bus outputs from the dual rail or 1-of-n QDI encoders (610). The multiplexing of low speed transmission buses alleviates congestion. Thus, the transmitter gasket for each bus may include a certain number of asynchronous multiplexers. As such, a corresponding number of de-multiplexers are inserted on the receiving side (612). The de-multiplexers de-multiplex the buses to its original speed.

Figure 7:
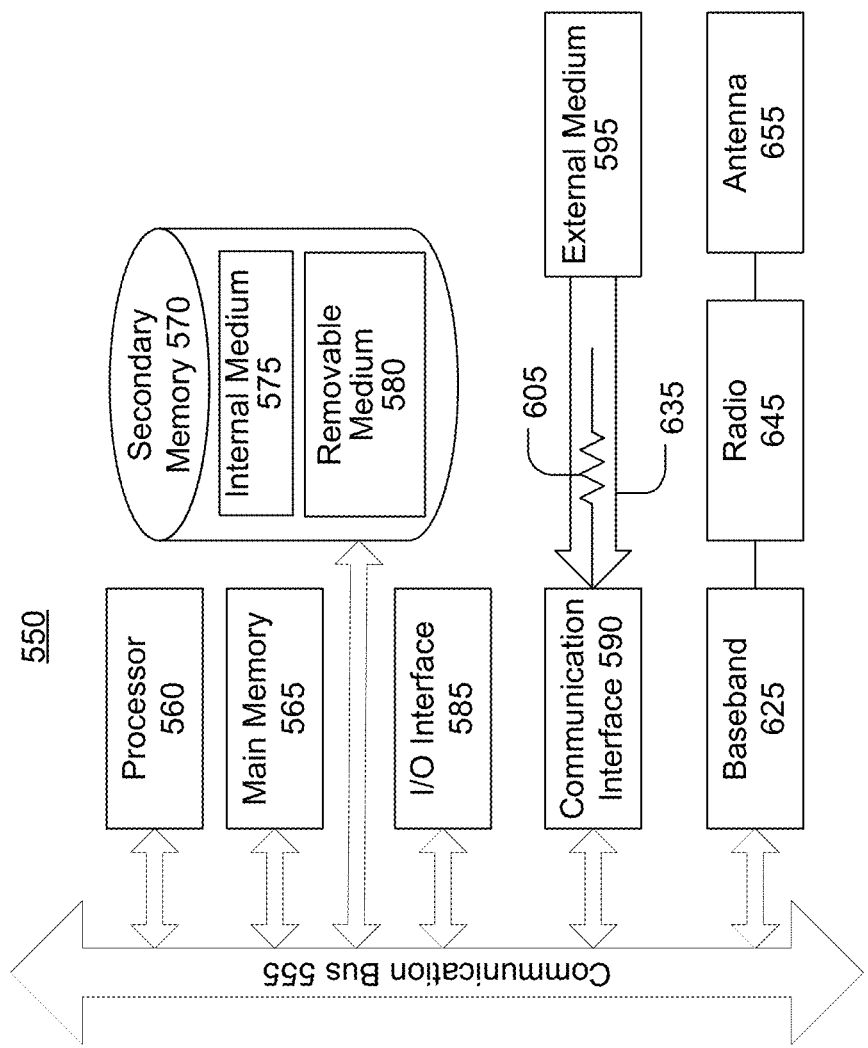
FIG. 7 is a block diagram illustrating a wired or wireless system according to various embodiments.

FIG. 7 is a block diagram illustrating a wired or wireless system 550 according to various embodiments. Referring to FIGS. 5, 6 and 7, the system 550 may be used to perform the process 600. In various embodiments, the system 550 may be a conventional personal computer, computer server, personal digital assistant, smart phone, tablet computer, or any other processor enabled device that is capable of wired or wireless data communication. A person having ordinary skill in the art can appreciate that other computer systems and/or architectures may be used without departing from the scope of the present inventive concept.

The system 550 preferably includes one or more processors, such as processor 560. Additional processors may be provided, such as an auxiliary processor to manage input/output, an auxiliary processor to perform floating point mathematical operations, a special-purpose microprocessor having an architecture suitable for fast execution of signal processing algorithms (e.g., digital signal processor), a slave processor subordinate to the main processing system (e.g., back-end processor), an additional microprocessor or controller for dual or multiple processor systems, or a coprocessor. Such auxiliary processors may be discrete processors or may be integrated with the processor 560.

The processor 560 is preferably connected to a communication bus 555. The communication bus 555 may include a data channel for facilitating information transfer between storage and other peripheral components of the system 550. The communication bus 555 further may provide a set of signals used for communication with the processor 560, including a data bus, address bus, and control bus (not shown). The communication bus 555 may comprise any standard or non-standard bus architecture such as, for example, bus architectures compliant with industry standard architecture ("ISA"), extended industry standard architecture ("EISA"), Micro Channel Architecture ("MCA"), peripheral component interconnect ("PCI") local bus, or standards promulgated by the Institute of Electrical and Electronics Engineers ("IEEE") including IEEE 488 general-purpose interface bus ("GPIB"), IEEE 696/S-100, and the like.

The system 550 preferably includes a main memory 565 and may also include a secondary memory 570. The main memory 565 provides storage of instructions and data for programs executing on the processor 560. The main memory 565 is typically semiconductor-based memory such as dynamic random access memory ("DRAM") and/or static random access memory ("SRAM"). Other semiconductor-based memory types include, for example, synchronous dynamic random access memory ("SDRAM"), Rambus dynamic random access memory ("RDRAM"), ferroelectric random access memory ("FRAM"), and the like, including read only memory ("ROM").

The secondary memory 570 may optionally include an internal memory 575 and/or a removable medium 580, for example a floppy disk drive, a magnetic tape drive, a compact disc ("CD") drive, a digital versatile disc ("DVD") drive, etc. The removable medium 580 is read from and/or written to in a well-known manner. Removable medium 580 may be, for example, a floppy disk, magnetic tape, CD, DVD, SD card, etc.

The removable medium 580 is a non-transitory computer readable medium having stored thereon computer executable code (i.e., software) and/or data. The computer software or data stored on the removable medium 580 is read into the system 550 for execution by the processor 560.

In alternative embodiments, secondary memory 570 may include other similar means for allowing computer programs or other data or instructions to be loaded into the system 550. Such means may include, for example, an external medium 595 and a communication interface 590. Examples of external medium 595 may include an external hard disk drive or an external optical drive, or and external magneto-optical drive.

Other examples of secondary memory 570 may include semiconductor-based memory such as programmable read-only memory ("PROM"), erasable programmable read-only memory ("EPROM"), electrically erasable read-only memory ("EEPROM"), or flash memory (block oriented memory similar to EEPROM). The removable medium 580 and the communication interface 590 allow software and data to be transferred from the external medium 595 to the system 550.

The system 550 may also include an input/output ("I/O") interface 585. The I/O interface 585 facilitates input from and output to external devices. For example the I/O interface 585 may receive input from a keyboard or mouse and may provide output to a display. The I/O interface 585 is capable of facilitating input from and output to various alternative types of human interface and machine interface devices alike.

The communication interface 590 allows software and data to be transferred between system 550 and external devices (e.g. printers), networks, or information sources. For example, computer software or executable code may be transferred to system 550 from a network server via communication interface 590. Examples of communication interface 590 include, for example, but not limited to, a modem, a network interface card ("NIC"), a wireless data card, a communications port, a PCMCIA slot and card, an infrared interface, and an IEEE 1394 fire-wire.

The communication interface 590 preferably implements industry promulgated protocol standards, such as Ethernet IEEE 802 standards, Fiber Channel, digital subscriber line ("DSL"), asynchronous digital subscriber line ("ADSL"), frame relay, asynchronous transfer mode ("ATM"), integrated digital services network ("ISDN"), personal communications services ("PCS"), transmission control protocol/Internet protocol ("TCP/IP"), serial line Internet protocol/point to point protocol ("SLIP/PPP"), and so on, but may also implement customized or non-standard interface protocols as well.

Software and data transferred via the communication interface 590 are generally in the form of electrical communication signals 605. In one exemplary embodiment, these electrical communication signals 605 are provided to the communication interface 590 via a communication channel 635. In one embodiment, the communication channel 635 may be a wired or wireless network, or any variety of other communication links. The communication channel 635 carries the electrical communication signals 605 and can be implemented using a variety of wired or wireless communication means including wire or cable, fiber optics, conventional phone line, cellular phone link, wireless data communication link, radio frequency ("RF") link, or infrared link, just to name a few.

Computer executable code (i.e., computer programs or software) is stored in the main memory 565 and/or the secondary memory 570. Computer programs can also be received via communication interface 590 and stored in the main memory 565 and/or the secondary memory 570. Such computer programs, when executed, enable the system 550 to perform the various functions of the present invention as previously described.

In this description, the term "computer readable medium" is used to refer to any non-transitory computer readable storage media used to provide computer executable code (e.g., software and computer programs) to the system 550. Examples of these media include the main memory 565, the secondary memory 570 (including the internal memory 575, the removable medium 580, and the external medium 595), and any peripheral device communicatively coupled with the communication interface 590 (including a network information server or other network device). These non-transitory computer readable mediums are means for providing executable code, programming instructions, and software to the system 550.

In one embodiment implemented using software, the software may be stored on a computer readable medium and loaded into the system 550 by way of the removable medium 580, the I/O interface 585, or the communication interface 590. In such an embodiment, the software is loaded into the system 550 in the form of electrical communication signals 605. The software, when executed by the processor 560, preferably causes the processor 560 to perform the inventive features and functions previously described herein.

The system 550 also includes optional wireless communication components that facilitate wireless communication over a voice and over a data network. The wireless communication components comprise an antenna system 655, a radio system 645 and a baseband system 625. In the system 550, radio frequency ("RF") signals are transmitted and received over the air by the antenna system 655 under the management of the radio system 645.

In one embodiment, the antenna system 655 may comprise one or more antennae and one or more multiplexors (not shown) that perform a switching function to provide the antenna system 655 with transmit and receive signal paths. In the receive path, received RF signals can be coupled from a multiplexor to a low noise amplifier (not shown) that amplifies the received RF signal and sends the amplified signal to the radio system 645.

In alternative embodiments, the radio system 645 may comprise one or more radios that are configured to communicate over various frequencies. In one embodiment, the radio system 645 may combine a demodulator (not shown) and modulator (not shown) in one integrated circuit ("IC"). The demodulator and modulator can also be separate components. In the incoming path, the demodulator strips away the RF carrier signal leaving a baseband receive audio signal, which is sent from the radio system 645 to the baseband system 625.

If the received signal contains audio information, then baseband system 625 decodes the signal and converts it to an analog signal. Then the signal is amplified and sent to a speaker. The baseband system 625 may also receive analog audio signals from a microphone. These analog audio signals are converted to digital signals and encoded by the baseband system 625. The baseband system 625 also codes the digital signals for transmission and generates a baseband transmit audio signal that is routed to the modulator portion of the radio system 645. The modulator mixes the baseband transmit audio signal with an RF carrier signal generating an RF transmit signal that is routed to the antenna system 655 and may pass through a power amplifier (not shown). The power amplifier amplifies the RF transmit signal and routes it to the antenna system 655 where the signal is switched to the antenna port for transmission.

The baseband system 625 may also be communicatively coupled with the processor 560. The processor 560 has access to main memory 565 and/or secondary memory 570. The processor 560 is preferably configured to execute instructions (i.e., computer programs or software) that can be stored in the main memory 565 or the secondary memory 570. Computer programs can also be received from the baseband system 625 and stored in the main memory 565 or in secondary memory 570, or executed upon receipt. Such computer programs, when executed, enable the system 550 to perform the various functions of the present invention as previously described. For example, the main memory 565 may include various software modules (not shown) that are executable by processor 560.

The accompanying claims and their equivalents are intended to cover such forms or modifications as would fall within the scope and spirit of the protection. For example, the example apparatuses, methods, and systems disclosed herein can be applied wireless communication devices incorporating HF and/or UHF RFID reader capabilities. The various components illustrated in the figures may be implemented as, for example, but not limited to, software and/or firmware on a processor, ASIC/FPGA/DSP, or dedicated hardware. Also, the features and attributes of the specific example embodiments disclosed above may be combined in different ways to form additional embodiments, all of which fall within the scope of the present disclosure.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A point-to-point connection between a first intellectual property (IP) block and a second IP block of an application specific integrated circuit (ASIC), the point-to-point connection comprising:
    a transmitter (TX) associated with the first IP block, the TX comprising one or more delay insensitive (DI) encoders and one or more temporal compressors, and configured to:
        transform input data signals from the first IP block into one or more temporally compressed DI asynchronous signals by dividing a cycle time into a plurality of temporal slots based on a temporal compression ratio and serially distributing portions of the input data signals into the plurality of temporal slots, wherein the cycle time limits a duration of time for the first IP block to transmit the input data signals and the second IP block to form the representation of the input signals, and
        serially transmit the temporally compressed DI asynchronous signals via a channel;
    a receiver (RX) associated with the second IP block, the RX comprising one or more DI decoders and one or more temporal decompressors, and configured to receive the one or more DI asynchronous signals via the channel and restore the one or more compressed DI asynchronous signals to form a representation of the input data signals compliant to an input data format of the second IP block; and
    wherein the channel is a timing independent channel between the first IP block and the second IP block, wherein the one or more DI asynchronous signals from the TX are propagated via the timing independent channel in a self-timed fashion to the RX.

2. The point-to-point connection as recited in claim 1, wherein the TX is configured to encode data symbols comprising two elements (a,b) using DI encoding that relies on three codewords A, B, and C and the RX is configured to decode the codewords (A, B, C) using DI encoding to form duplicates of the data symbols (a,b).

3. The point-to-point connection as recited in claim 1, wherein the TX is configured to encode data symbols comprising two elements (a,b) using DI encoding that relies on four codewords A, B, C and D, and the RX is configured to decode the codewords (A, B, C and D) using DI decoding to form duplicates of the data symbols (a,b).

4. The point-to-point connection as recited in claim 1, wherein the TX is configured to encode data symbols comprising four elements (a, b, c, d) using DI encoding that relies on four symbols A, B, C and D, and the RX is configured to decode the codewords (A, B, C and D) using DI decoding to form duplicates of the data symbols (a, b, c, d).

5. The point-to-point connection as recited in claim 1, wherein the TX is configured to use a selected one of a plurality of DI encoding schemes to transform the input data signals into the compressed DI asynchronous signals and the RX is configured to restore the one or more compressed DI asynchronous signals to form the representation of the input data signals compliant to the input data format of the second IP block.

6. The point-to-point connection as recited in claim 1, wherein the one or more temporal compressors receive encoded data signals from the one or more DI encoders based on the input data.

7. The point-to-point connection as recited in claim 1, wherein the RX is configured to receive the one or more DI asynchronous signals from the TX via the channel, the received one or more DI asynchronous signals indicative of all of the input data signals received at the TX from the first IP block and transformed by the TX.

8. The point-to-point connection as recited in claim 1, wherein the one or more DI encoders are communicatively coupled between the first IP block and the one or more temporal compressors.

9. The point-to-point connection as recited in claim 1, wherein the RX comprises one or more temporal decompressors communicatively coupled between one or more temporal compressors and the one or more DI decoders.

10. The point-to-point connection as recited in claim 1, wherein the point-to-point connection is configured to operate using analog signals.

11. The point-to-point connection as recited in claim 1, wherein the point-to-point connection is configured to operate using digital signals.

12. The point-to-point connection as recited in claim 1, wherein the point-to-point connection is configured to operate over a wireless data connection.

13. The point-to-point connection as recited in claim 1, wherein the point-to-point connection is configured to operate over a wired data connection.

* * * * *